United States Patent
Long et al.

(10) Patent No.: US 12,199,192 B1
(45) Date of Patent: Jan. 14, 2025

(54) TRENCH SCHOTTKY BARRIER RECTIFIER AND METHOD FOR FABRICATING SAME

(71) Applicant: Diodes Incorporated, Plano, TX (US)

(72) Inventors: Tao Long, Shanghai (CN); Ze Rui Chen, Plano, TX (US); Pin-Hao Huang, New Taipei (TW); Bau-Shun Huang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/415,503

(22) Filed: Jan. 17, 2024

Related U.S. Application Data

(63) Continuation of application No. PCT/CN2023/138355, filed on Dec. 13, 2023.

(30) Foreign Application Priority Data

Aug. 8, 2023 (CN) .......................... 202310996087.1

(51) Int. Cl.
*H01L 29/78* (2006.01)
*H01L 29/36* (2006.01)
(Continued)

(52) U.S. Cl.
CPC .......... *H01L 29/8725* (2013.01); *H01L 29/36* (2013.01); *H01L 29/66143* (2013.01)

(58) Field of Classification Search
CPC  H01L 29/8725; H01L 29/36; H01L 29/66143
See application file for complete search history.

(56) References Cited

U.S. PATENT DOCUMENTS

| 5,612,567 A | 3/1997 | Baliga |
| 9,368,650 B1 * | 6/2016 | Yen ..................... H01L 29/0688 |

(Continued)

FOREIGN PATENT DOCUMENTS

| CN | 104134702 A | 11/2014 |
| CN | 105742338 A | 7/2016 |

(Continued)

OTHER PUBLICATIONS

Office Action and Search Report from Taiwan Patent Application No. 112142870, dated Aug. 19, 2024, 4 pages.
(Continued)

*Primary Examiner* — Samuel Park
(74) *Attorney, Agent, or Firm* — Kilpatrick Townsend & Stockton LLP

(57) ABSTRACT

A semiconductor rectifier device includes: an epitaxial layer, having a top surface and a bottom surface; a first doped region having a first conductivity type, located in the epitaxial layer; a first trench structure, located in the first doped region; a second trench structure adjacent to the first trench structure, located in the first doped region; a second doped region having a second conductivity type, located in the epitaxial layer between the first trench structure and the second trench structure, wherein a depth of the second doped region is less than a depth of the first trench structure; and a metal layer, located on the top surface of the epitaxial layer, covering the first trench structure, the second trench structure, and the second doped region, wherein the metal layer is in contact with the top surface, forming a Schottky interface.

21 Claims, 11 Drawing Sheets

(51) Int. Cl.
   *H01L 29/66*   (2006.01)
   *H01L 29/872*  (2006.01)

(56) References Cited

U.S. PATENT DOCUMENTS

| | | | | |
|---|---|---|---|---|
| 2005/0029993 | A1* | 2/2005 | Hadizad | H02M 3/1588 |
| | | | | 257/E27.012 |
| 2009/0309181 | A1* | 12/2009 | Hsieh | H01L 29/872 |
| | | | | 257/471 |
| 2009/0315106 | A1* | 12/2009 | Hsieh | H01L 29/47 |
| | | | | 257/334 |
| 2021/0376169 | A1 | 12/2021 | Tsai et al. | |
| 2023/0215920 | A1 | 7/2023 | Hsieh | |

FOREIGN PATENT DOCUMENTS

| | | | | | |
|---|---|---|---|---|---|
| CN | 105810755 | A | * | 7/2016 | |
| CN | 106784021 | A | * | 5/2017 | ......... H01L 29/0607 |
| CN | 107170837 | A | | 9/2017 | |
| KR | 20170075289 | A | | 7/2017 | |
| TW | 202147628 | A | | 12/2021 | |
| TW | 202326825 | A | | 7/2023 | |

OTHER PUBLICATIONS

International Application No. PCT/CN2023/138355, International Search Report and Written Opinion mailed on Apr. 7, 2024, 7 pages.

* cited by examiner

TRENCH SCHOTTKY BARRIER RECTIFIER AND METHOD FOR FABRICATING SAME

CROSS-REFERENCES TO RELATED APPLICATIONS

This application is a continuation of International Patent Application No. PCT/CN2023/138355, filed Dec. 13, 2023, which claims priority to Chinese patent application No. 202310996087.1, filed on Aug. 8, 2023, the disclosures of which are hereby incorporated by reference in their entirety.

TECHNICAL FIELD

The present invention relates to the structure of a semiconductor rectifier device and a fabrication method therefor, and more specifically, to the structure of a Schottky barrier rectifier device and a fabrication method therefor.

BACKGROUND

It is well known that power supply circuits require power supply rectifiers, and with the advancement of time and technology, power supply rectifiers need to have good power supply switching performance and low power consumption. A Schottky rectifier has a low forward voltage, facilitating forward power loss. However, the Schottky rectifier also has a high reverse leakage, resulting in a high reverse power loss. The Schottky barrier height affects the forward voltage (VF) and reverse current (IR). For example, reducing the Schottky barrier height can reduce VF but will cause IR to rise, resulting in increased reverse power loss. How to reduce IR while reducing VF while also maintaining a breakdown voltage (BV) has become a technical bottleneck in the art.

SUMMARY

Embodiments of the present disclosure relate to a semiconductor rectifier device. The semiconductor rectifier device includes an epitaxial layer, having a top surface and a bottom surface opposite to each other. The semiconductor rectifier device also includes a first doped region, located in the epitaxial layer, where the first doped region has a first conductivity type. The semiconductor rectifier device also includes a first trench structure, located in the first doped region and extending from the top surface toward the bottom surface. The semiconductor rectifier device also includes a second trench structure, located in the first doped region and extending from the top surface toward the bottom surface, where the second trench structure is adjacent to the first trench structure. The semiconductor rectifier device also includes a second doped region, located in the epitaxial layer between the first trench structure and the second trench structure, and extending from the top surface toward the bottom surface, where the second doped region has a second conductivity type, and a depth of the second doped region is less than a depth of the first trench structure. The semiconductor rectifier device also includes a metal layer, located on the top surface of the epitaxial layer, covering the first trench structure, the second trench structure, and the second doped region, where the metal layer is in contact with the top surface, forming a Schottky interface.

Implementations may include one or more of the following features. In some embodiments, a doping concentration of the first doped region increases from the top surface toward the bottom surface. In some embodiments, a doping concentration of the first doping region adjacent to the top surface is between $4 \times 10^{15}$ and $7 \times 10^{15}$ cm$^{-3}$, and a doping concentration of the first doping region adjacent to the bottom surface is between $1 \times 10^{16}$ and $4 \times 10^{16}$ cm$^{-3}$. In some embodiments, a distance from a center of the second doped region to the first trench structure is approximately equal to a distance from the center of the second doped region to the second trench structure. In some embodiments, a width of the second doped region is between 0.3 microns and 0.6 microns. In some embodiments, a depth of the second doped region is between 0.2 microns and 0.8 microns. In some embodiments, a doping concentration of the second doped region is between $1 \times 10^{16}$ and $1 \times 10^{18}$ cm$^{-3}$. In some embodiments, a top surface of the first trench structure or a top surface of the second trench structure is vertically aligned with the top surface of the epitaxial layer. In some embodiments, the first trench structure may include a first dielectric layer and a first electrode layer surrounded by the first dielectric layer, and the second trench structure may include a second dielectric layer and a second electrode layer surrounded by the second dielectric layer. In some embodiments, the semiconductor rectifier device may include: an anode electrode, located on the metal layer; a substrate, coupled to the bottom surface of the epitaxial layer; and a cathode electrode, in contact with the substrate. In some embodiments, the depth of the first trench structure is between 8 microns and 10 microns, and a depth of the second trench structure is approximately equal to the depth of the first trench structure.

Embodiments of the present disclosure relate to a fabrication method for a semiconductor rectifier device. The method includes forming an epitaxial layer having a first conductivity type on a substrate. The method also includes forming a first trench structure and a second trench structure adjacent to the first trench structure in the epitaxial layer. The method also includes forming a doped region having a second conductivity type in the epitaxial layer between the first trench structure and the second trench structure. The method also includes forming a metal layer on the epitaxial layer, where the metal layer covers the first trench structure, the second trench structure, and the doped region.

Implementations may include one or more of the following features. In some embodiments, forming the epitaxial layer having the first conductivity type may include: introducing ions having the first conductivity type by epitaxial growth, where a concentration of the introduced ions decreases over time during the epitaxial growth, and a doping concentration of the epitaxial layer decreases from a bottom surface of the epitaxial layer to a top surface of the epitaxial layer. In some embodiments, forming the first trench structure and the second trench structure may include: forming a patterned layer on a top surface of the epitaxial layer to define locations of the first trench structure and the second trench structure; forming a first trench and a second trench using the patterned layer as a mask; forming a dielectric layer conformally covering the epitaxial layer, where a first part of the dielectric layer conformally covers the first trench, and a second part of the dielectric layer conformally covers the second trench; forming a polysilicon layer on the dielectric layer, where a first part of the polysilicon layer fills the first trench structure, and a second part of the polysilicon layer fills the second trench structure; and removing the polysilicon layer and the dielectric layer located above the top surface of the epitaxial layer, where a top surface of the first trench structure, a top surface of the second trench structure, and the top surface of the epitaxial layer are vertically aligned. In some embodiments, removing the polysilicon layer and the dielectric layer located above the top surface of the epitaxial layer may include: performing a first etching process against the polysilicon layer to remove a portion of the polysilicon layer; and performing a second etching process against the dielectric layer to remove a portion of the dielectric layer. In some embodiments, a thickness of the dielectric layer is between 0.2 microns and 2 microns. In some embodiments, the metal layer may include titanium, molybdenum, nickel, platinum, nickel platinum, an alloy thereof, or a combination thereof. In some embodiments, the method may include: forming an anode electrode on the metal layer; reducing a thickness of substrate from a backside of the substrate; and forming a cathode electrode coupled to the backside of the substrate. In some embodiments, the anode electrode may include aluminum, an aluminum silicon alloy, and an aluminum silicon copper alloy, and the cathode electrode may include: a titanium nickel silver alloy. In some embodiments, the anode electrode has a flat bottom surface interfacing with a top surface of the epitaxial layer.

BRIEF DESCRIPTION OF THE DRAWINGS

When the following detailed description is read with reference to the accompanying drawings, aspects of several embodiments of the present disclosure may be best understood. It should be noted that various structures may not be drawn to scale. Indeed, for clarity of discussion, the dimensions of the various structures can be arbitrarily enlarged or reduced.

Figure 1:
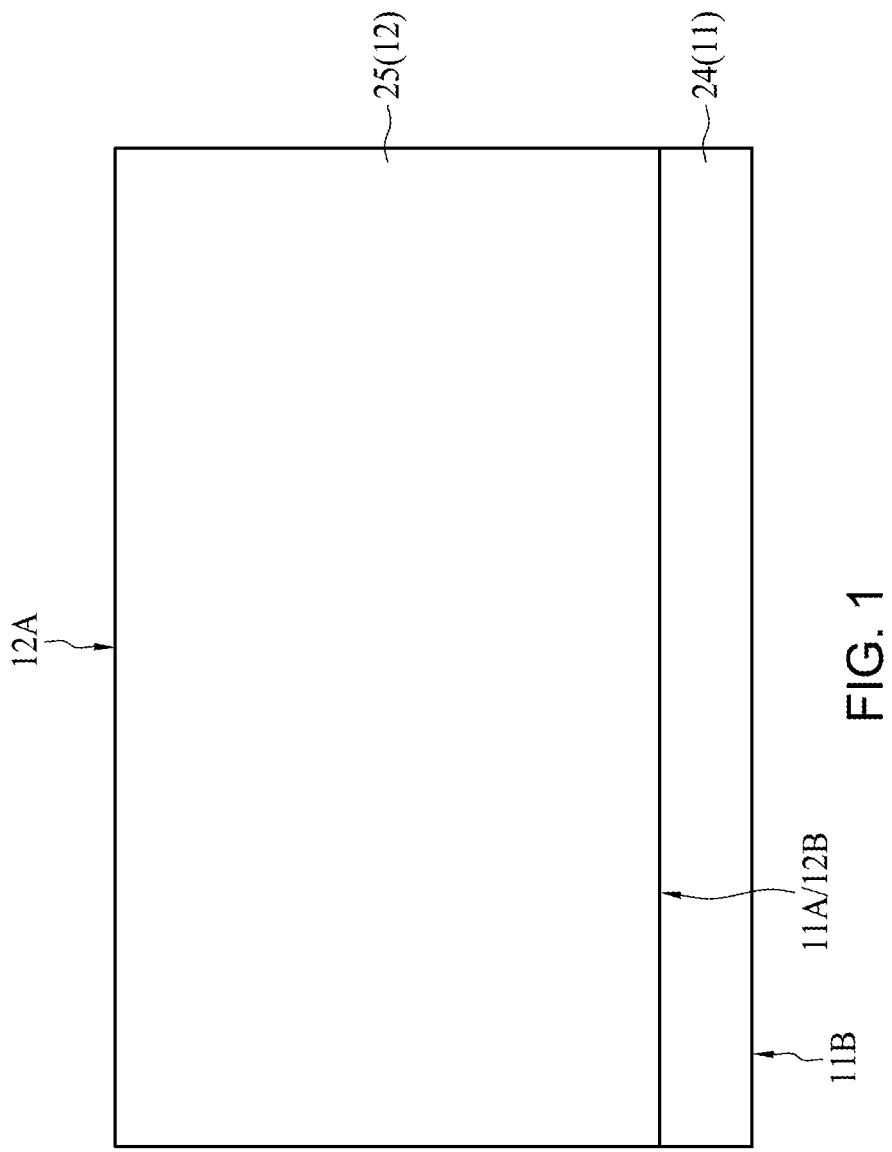
FIG. 1 is a diagram illustrating a semiconductor rectifier device at one stage of the fabrication method according to certain embodiments of the present application.

The same or similar components are denoted with the same reference signs in the drawings and detailed description. Several embodiments of the present disclosure will be immediately understood from the following detailed description with reference to the accompanying drawings.

DETAILED DESCRIPTION OF THE EMBODIMENTS

The following disclosure provides numerous different embodiments or examples for implementing different features of the presented subject matter. Specific examples of components and configurations will be described below. Of course, these are merely examples and are not intended to be limiting. In the present disclosure, the reference to forming a first feature above or on a second feature may include an embodiment in which the first feature and the second feature are formed in direct contact, and may further include an embodiment in which another feature may be formed between the first feature and the second feature such that the first feature and the second feature may not be in direct contact. Moreover, reference numerals and/or letters may be repeated in various examples of the present disclosure. This repetition is for simplicity and clarity of illustration and itself does not indicate a relationship between various embodiments and/or configurations discussed.

The embodiments of the present disclosure will be discussed in detail below. However, it should be understood that the present disclosure provides a number of applicable concepts that can be embodied in a wide variety of particular environments. The specific embodiments discussed are merely illustrative and do not limit the scope of the present disclosure.

The present disclosure provides the structure of a semiconductor rectifier device and a fabrication method therefor. Compared to a fabrication method for a general semiconductor rectifier device, the semiconductor rectifier device of the present disclosure has a Schottky barrier structure, and further, the Schottky barrier junction rectifier of the present disclosure has low electric field strength at an interface of a metal and a semiconductor. Therefore, the semiconductor rectifier device of the present disclosure can achieve the effect of reducing IR while also maintaining low VF, and has the effect of improving reverse leakage. Therefore, the structure of the present disclosure can achieve the effect of reducing IR without increasing VF, and provides a rectifier device having improved reverse leakage.

FIGS. 1 to 10 illustrate one or more stages in a fabrication method for a semiconductor rectifier device 1 according to certain embodiments of the present solution. At least some of these figures have been simplified to facilitate a better understanding of aspects of the present disclosure.

Referring to FIG. 1, the fabrication method for the semiconductor rectifier device 1 includes performing epitaxial growth on a surface 11A of a substrate 11 to form an epitaxial layer 12, and forming a doped region 25 in the epitaxial layer 12. The substrate 11 has opposite surfaces 11A and 11B. In some embodiments, the surface 11A and the surface 11B may be horizontal surfaces. For convenience of description, a direction orthogonal to the surface 11A and the surface 11B is defined as a vertical direction, and a direction orthogonal to the vertical direction is defined as a horizontal direction. In some embodiments, the surface 11A is the top surface of the substrate 11, and the surface 11B is the bottom surface of the substrate 11. In some embodiments, the surface 11A is the top surface of a silicon wafer. The substrate 11 shown in FIG. 1 may simply be a part of the silicon wafer near the top surface. The material of the substrate 11 may be polycrystalline silicon or single-crystal silicon. The substrate 11 may include a doped region 24. For example, substrate 11 includes a p-type doped region configurable as an n-type transistor and an n-type doped region configurable as a p-type transistor. The N-type doped region is doped with an n-type dopant, such as phosphorus, arsenic, other n-type dopants, or a combination thereof. The P-type doped region is doped with a p-type dopant, such as boron, indium, other p-type dopants, or a combination thereof. The N-type or P-type doped region may be formed by performing an ion implantation process, a diffusion process, and/or other suitable doping processes. The doped region 24 of the substrate 11 extends from the surface 11A toward the surface 11B. In some embodiments, the doped region 24 of the substrate 11 covers the entire surface 11A. In some embodiments, the doped region 24 of the substrate 11 has a first conductivity type. For convenience of description, the following is described with the first type being N-type and the second type being P-type as an example. However, the present disclosure is not limited thereto. The N-type (first type) or P-type (second type) substrate 11 may be adjusted according to the conductivity type of the semiconductor rectifier device 1. It should be noted that the substrate 11 shown in FIG. 1 may be only a part of the silicon wafer near the top surface, or in other words, FIG. 1 shows only a part of the doped region 24 of the substrate 11. In some embodiments, the doped region 24 of the substrate 11 serves as a cathode doped region of the semiconductor rectifier device 1. In some embodiments, the concentration range of the doped region 24 of the substrate 11 is between $1\times10^{19}$ and $7\times10^{19}$ cm$^{-3}$.

The epitaxial layer 12 has the same conductivity type as the substrate 11, i.e., the first type of doping. The material of the epitaxial layer 11 may be polycrystalline silicon, single-crystal silicon, silicon carbide, silicon germanium, or other suitable semiconductor materials. In some embodiments, ions having N-type electrical properties are introduced by epitaxial growth to form the N-type epitaxial layer 12 without the need for additional ion implantation. Therefore, the ions having N-type electrical properties can be distributed in the entire epitaxial layer 12 to form a doped region 25 located in the entire epitaxial layer 12. The epitaxial layer 12 may have a surface 12A and a surface 12B opposite to the surface 12A. In some embodiments, the surface 12A and the surface 12B may be horizontal surfaces. In some embodiments, the surface 12A is the top surface of the epitaxial layer 12, and the surface 12B is the bottom surface of the epitaxial layer 12. In some embodiments, the surface 12B of the epitaxial layer 12 is in contact with the surface 11A of the substrate 11, and the substrate 11 is coupled to the (bottom) surface 12B of the epitaxial layer 12.

The thickness and doping concentration of the epitaxial layer 12 may be adjusted according to voltage requirements of an apparatus. In some embodiments, the thickness range of the epitaxial layer 12 is between 6-12 micrometers (μm). In some embodiments, the thickness range of the epitaxial layer 12 is between 8-10 micrometers (μm). In some embodiments, the epitaxial layer 12 may have a uniform doping concentration. For example, the doping concentration is between $5\times10^{14}$ and $1\times10^{16}$ cm$^{-3}$. In some embodiments, ions having N-type electrical properties are evenly or uniformly introduced during the epitaxial growth process to form the epitaxial layer 12 having a uniform doping concentration, and the concentration of the ions introduced during the epitaxial growth process does not change over time. In some embodiments, the epitaxial layer 12 may have an increasing doping concentration gradient from the surface 12A toward the surface 12B. For example, the doping concentration adjacent to the surface 12A is between $4\times10^{15}$ and $7\times10^{15}$ cm$^{-3}$, and the doping concentration adjacent to the surface 12B is between $1\times10^{16}$ and $4\times10^{16}$ cm$^{-3}$. In some embodiments, ions having N-type electrical properties are introduced during the epitaxial growth process, and the concentration of the introduced ions decreases over time during the epitaxial growth to form an epitaxial layer 12 having a decreasing doping concentration.

In the above embodiment in which the epitaxial layer 12 has a doping concentration gradient, the doping concentration of the surface 12A of the epitaxial layer 12 is reduced. Although the reduced doping concentration of the surface 12A may cause an increase in the resistivity of the surface 12A, the increased doping concentration inside the epitaxial layer 12 causes a reduction in the internal resistivity. Therefore, VF can be further reduced while BV is maintained. In some embodiments, the doping concentration of the part of the epitaxial layer 12 adjacent to the surface 12A is approximately one order (of magnitude) lower than the doping concentration of the part adjacent to the surface 12B, that is, the concentration difference between the two is approximately $1\times10$ cm$^{-3}$.

Figure 2:
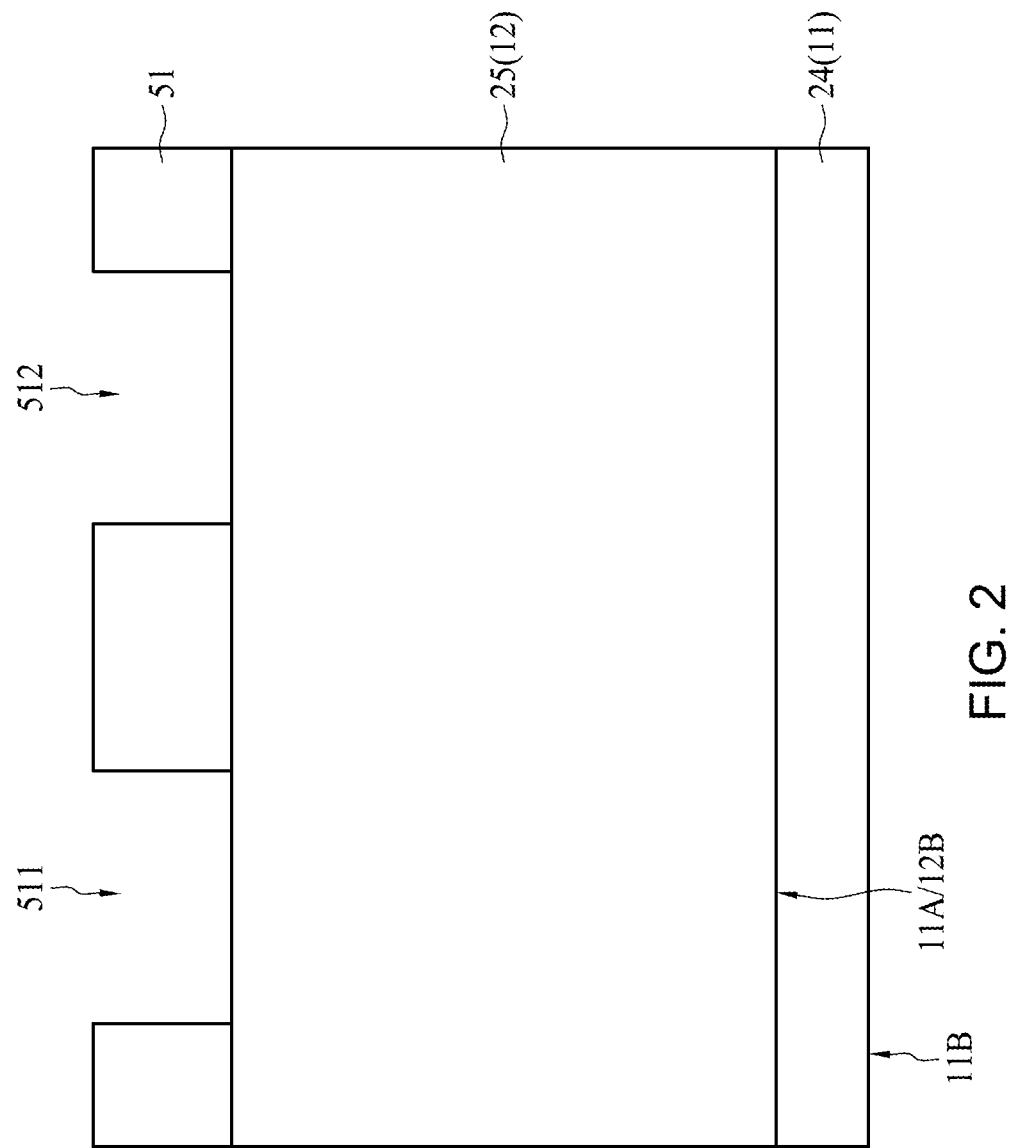
FIG. 2 is a diagram illustrating a semiconductor rectifier device at one stage of the fabrication method according to certain embodiments of the present application.

Referring to FIG. 2, the fabrication method for the semiconductor rectifier device 1 includes forming a patterned layer 51 on the surface 12A of the epitaxial layer 12 to expose a part of the epitaxial layer 12. The patterned layer 51 is used to define the locations of trenches that are subsequently formed. In some embodiments, the patterned layer 51 has an opening 511 and an opening 512 exposing parts of the epitaxial layer 12. The patterned layer 51 may be a material layer suitable to serve as a mask for subsequent etching processes, such as a photomask, a hardened layer, and a dielectric layer (such as an oxide layer or a nitride layer). In some embodiments, the patterned layer 51 includes an oxide (e.g., silicon oxide). In some embodiments, an oxide layer is formed so that the entire layer covers the surface 12A of the epitaxial layer 12, a patterned photomask is formed on the oxide layer, a part of the oxide layer is removed using the patterned photomask, and then the patterned photomask is removed to form the patterned layer 51 that exposes a part of the silicon carbide layer 12.

Figure 3:
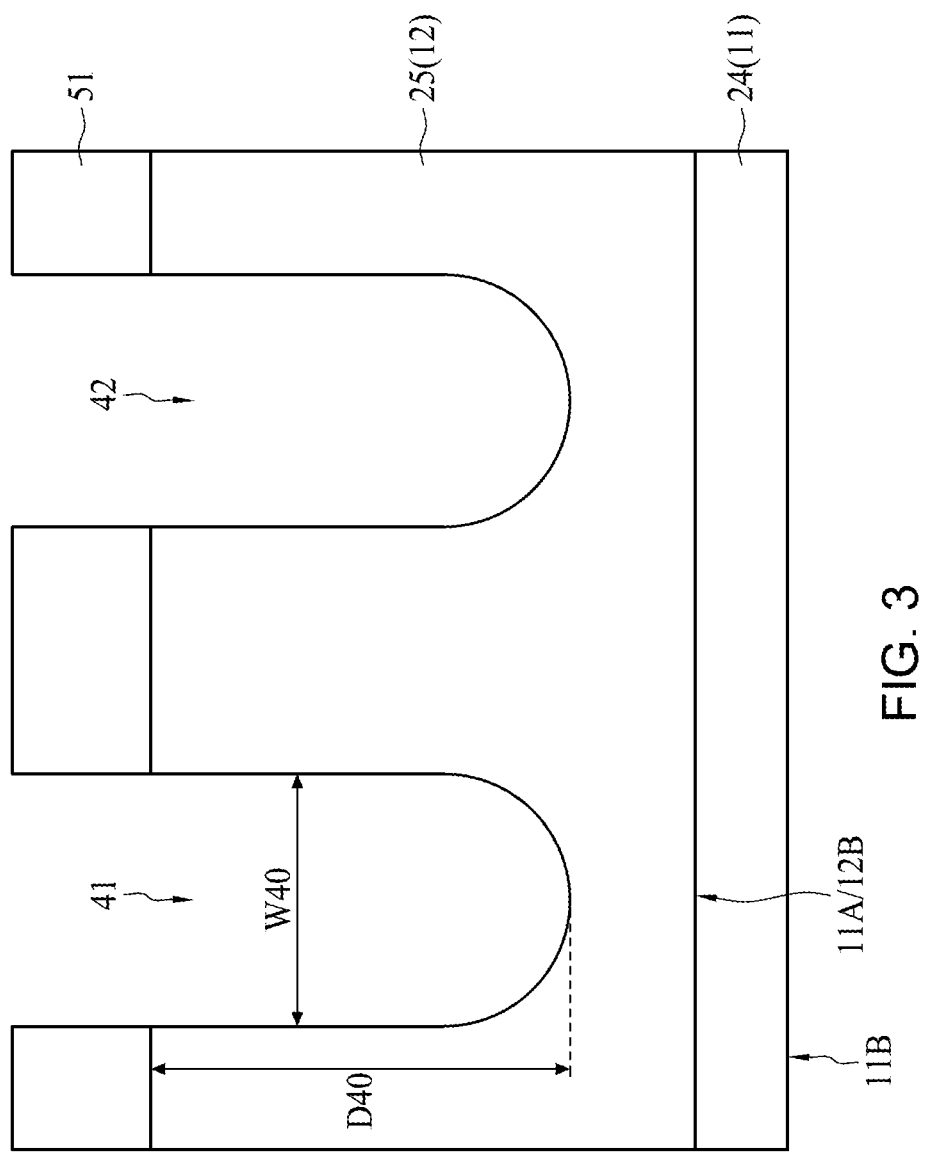
FIG. 3 is a diagram illustrating a semiconductor rectifier device at one stage of the fabrication method according to certain embodiments of the present application.

Referring to FIG. 3, the fabrication method for the semiconductor rectifier device 1 includes performing an etching process against the epitaxial layer 12 using the patterned layer 51 as a mask to form a plurality of trenches (trenches 41 and 42 shown in FIG. 3). The plurality of trenches are adjacent to each other and extend from the surface 12A of the epitaxial layer 12 toward the surface 12B. Since the trenches are formed through the same etching step, the plurality of trenches have approximately the same depth. In some embodiments, the trench 41 and the trench 42 have approximately the same depth D40. In some embodiments, the depth D40 of the trench 41 or the trench 42 is between 5 μm and 30 μm. In some embodiments, the depth D40 of the trench 41 or the trench 42 is between 8 μm and 10 μm. The width of the trenches 41 and 42 may be determined by the openings 511 and 512. In some embodiments, the trench 41 and the trench 42 have approximately the same width W40. In some embodiments, the width W40 of the trench 41 or the trench 42 is between 0.5 μm and 3 μm. In some embodiments, the width W40 of the trench 41 or the trench 42 is between 1.3 μm and 1.7 μm. The width and depth of the trench 41 and the trench 42 may be set and adjusted according to a voltage required by the apparatus. Within the scope of the above disclosed embodiments, as the value of the depth D40 of trenches 41, 42 becomes greater, the resistivity of the epitaxial layer 12 may be reduced.

Figure 4:
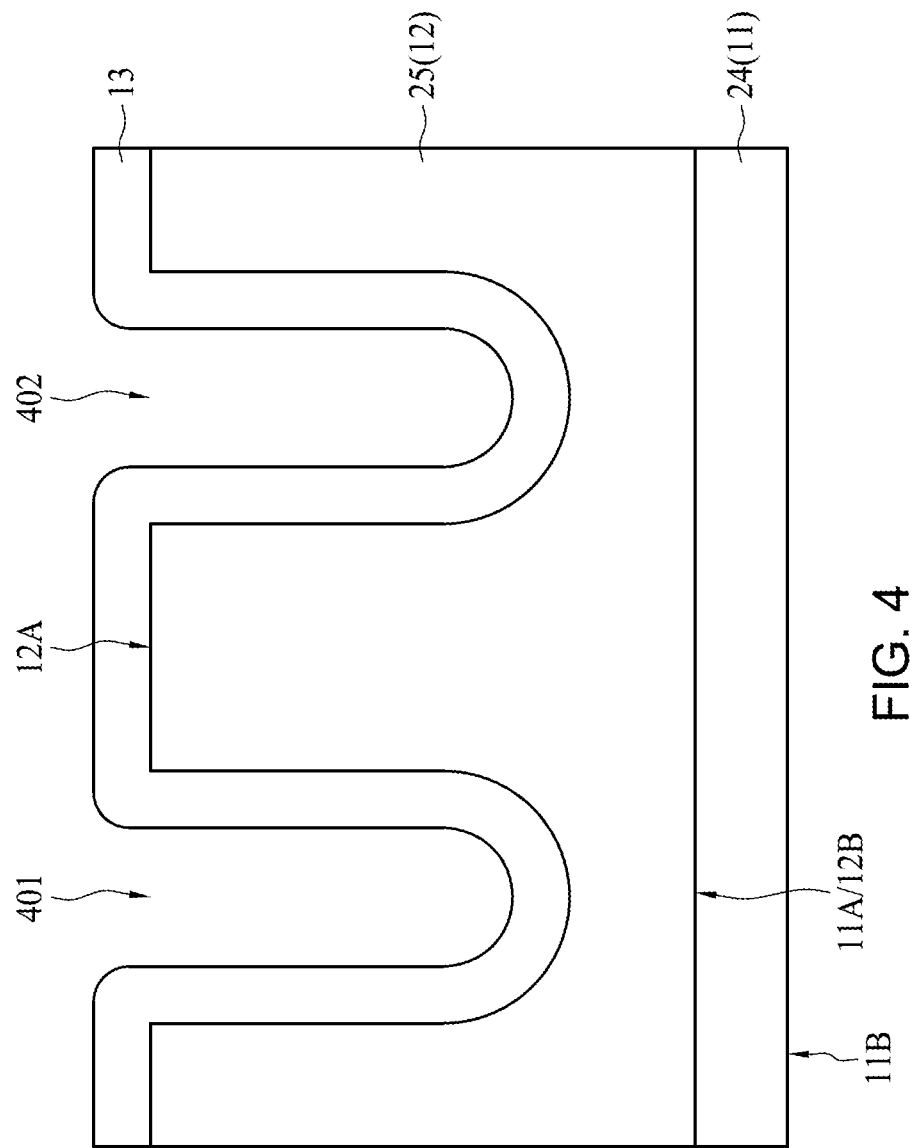
FIG. 4 is a diagram illustrating a semiconductor rectifier device at one stage of the fabrication method according to certain embodiments of the present application.

Referring to FIG. 4, the fabrication method for the semiconductor rectifier device 1 includes forming a dielectric layer 13 filled in the trench 41 and the trench 42. In some embodiments, the dielectric layer 13 may be formed by atomic layer deposition (ALD), chemical vapor deposition (CVD), or other deposition processes. In some embodiments, the dielectric layer 13 may be formed by thermal oxidation technology. In some embodiments, the dielectric layer 13 conformally covers the trench 41 and the trench 42, serving as a liner layer in the trench 41 and the trench 42. In some embodiments, the dielectric layer 13 may be shape-preservingly or conformally deposited on inner surfaces (including opposing sidewalls and a bottom extending between the sidewalls) of the trenches 41 and 42 and the surface 12A of the epitaxial layer 12. In some embodiments, the dielectric layer 13 may be filled into the trenches 41 and 42 through a deposition process, and then a photolithography and etching process is performed to locally remove the dielectric layer 13 to form at least one groove in the dielectric layer 13. The thickness of the dielectric layer 13 may be set and adjusted according to the voltage required by the apparatus. In some embodiments, the thickness of the dielectric layer 13 is between 0.1 μm and 2 μm. In some embodiments, the thickness of the dielectric layer 13 is between 0.2 μm and 1.2 μm. In some embodiments, the thickness of the dielectric layer 13 is between 0.5 μm and 0.8 μm.

The voltage of the semiconductor rectifier device 1 may generally be determined by both the doping concentration of the epitaxial layer 12 and the thickness of the dielectric layer 13. Therefore, the steps shown in FIGS. 1 and 4 will determine the voltage of the semiconductor rectifier device 1.

Figure 5:
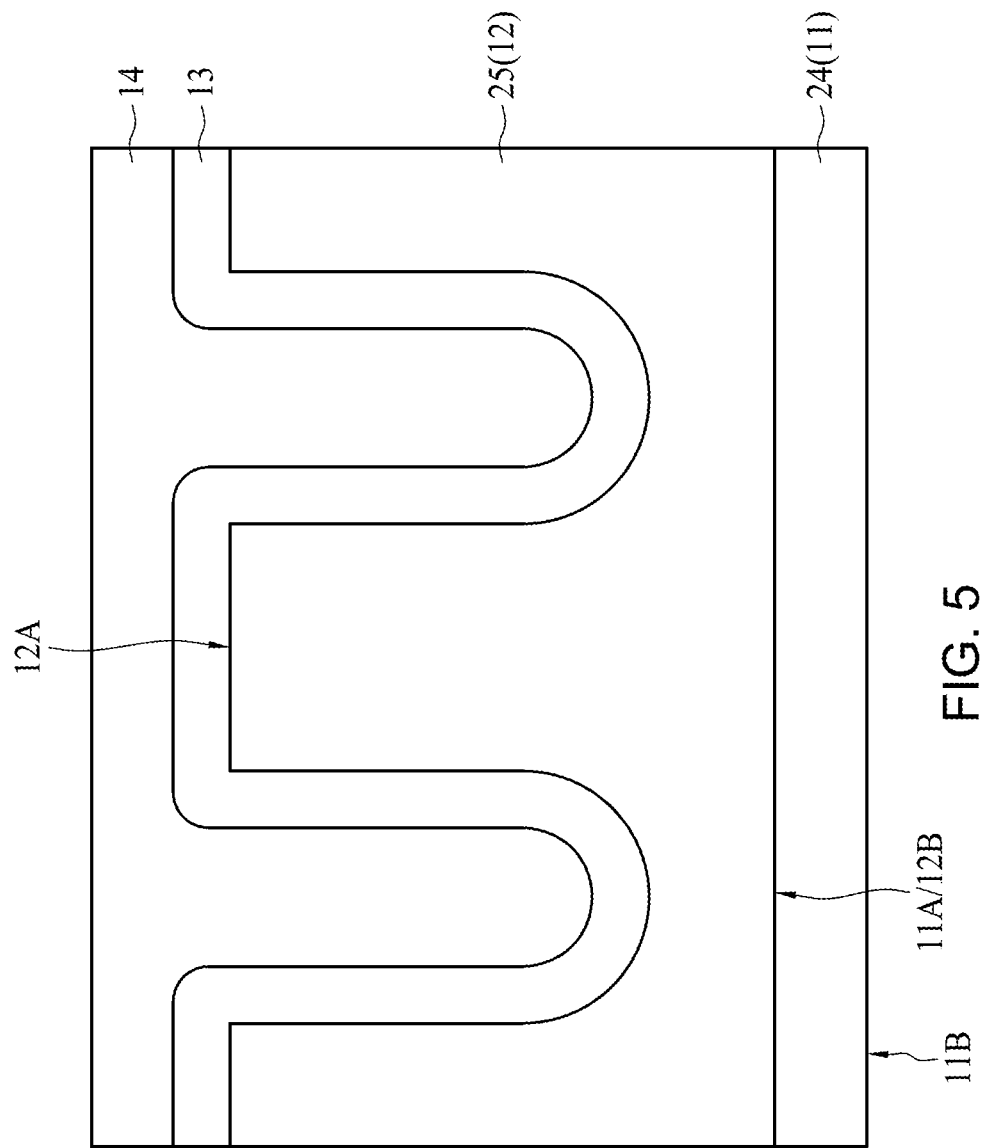
FIG. 5 is a diagram illustrating a semiconductor rectifier device at one stage of the fabrication method according to certain embodiments of the present application.

Referring to FIG. 5, the fabrication method for the semiconductor rectifier device 1 includes forming a semiconductor material layer 14, and the semiconductor material layer 14 fills in the trench 41 and the trench 42. In some embodiments, the semiconductor material layer 14 may be formed by physical vapor deposition (PVD), CVD, or other deposition processes. In some embodiments, the semiconductor material layer 14 fills the trenches 41 and 42 and covers the surface 12A of the epitaxial layer 12. In some embodiments, the semiconductor material layer 14 includes polysilicon.

Figure 6:
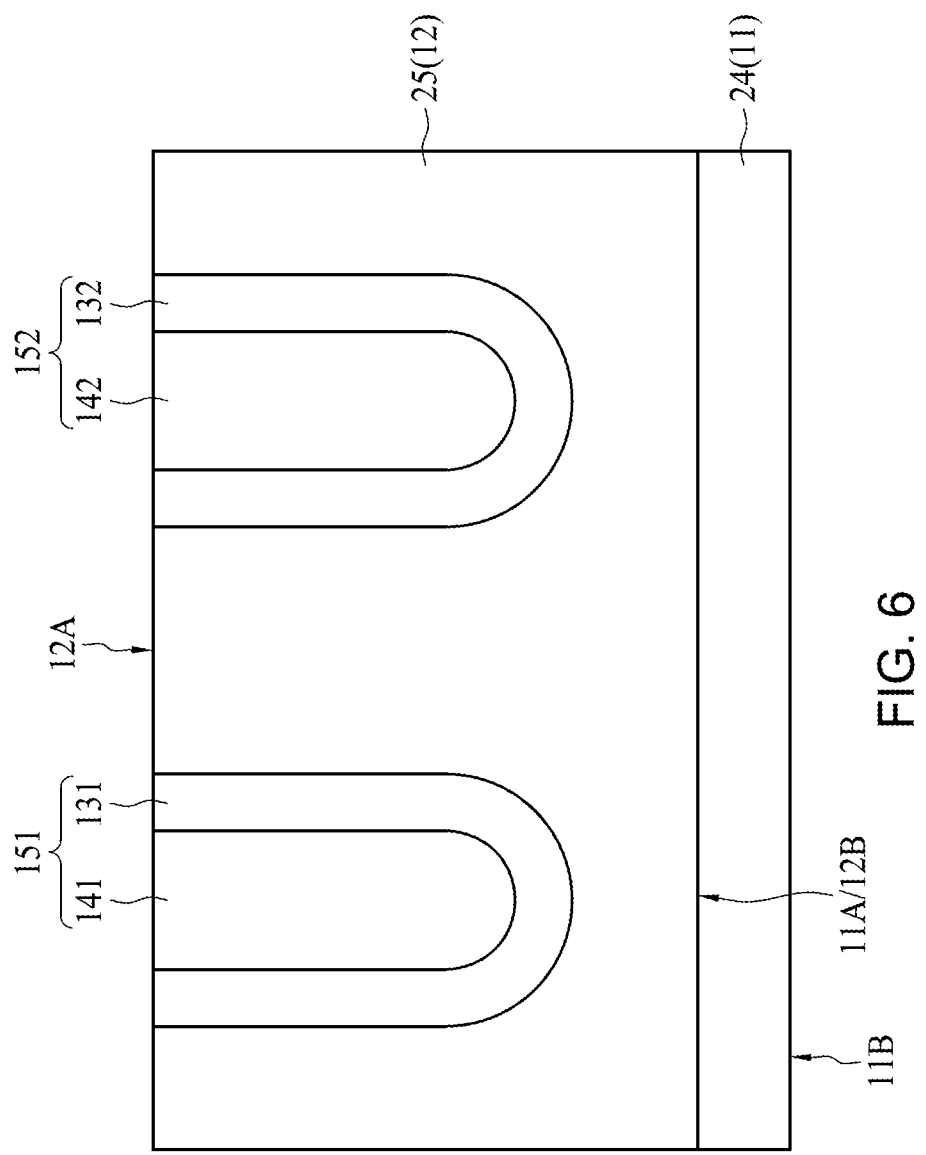
FIG. 6 is a diagram illustrating a semiconductor rectifier device at one stage of the fabrication method according to certain embodiments of the present application.

Referring to FIG. 6, the fabrication method for the semiconductor rectifier device 1 includes removing parts of the semiconductor material layer 14 and the dielectric layer 13 located outside the trenches 41 and 42. In some embodiments, the semiconductor material layer 14 outside the trenches 41 and 42 is removed to form a first electrode layer 141 and a second electrode layer 142 in the trenches 41 and 42, respectively. In some embodiments, the semiconductor material layer 14 is subjected to a grinding process, such as a chemical mechanical polishing (CMP) process to remove the semiconductor material layer 14 outside the trenches 41 and 42. In other embodiments, the method of removing the part of the semiconductor material layer 14 located outside the trenches 41 and 42 may also include an etching process, such as a wet etching or dry etching process. In some embodiments, after removing the semiconductor material layer 14 on the surface 12A of the epitaxial layer 12, a similar process is performed on the dielectric layer 13 to form a first dielectric layer 131 and a second dielectric layer 132 in the trenches 41 and 42, respectively. In some embodiments, the first dielectric layer 131 surrounds the first electrode layer 141, and the second dielectric layer 132 surrounds the second electrode layer 142. For convenience of description, the first electrode layer 141 and the first dielectric layer 131 are collectively referred to as a first trench structure 151. Similarly, the second electrode layer 142 and the second dielectric layer 132 are collectively referred to as a second trench structure 152. In some embodiments, top surfaces of the first electrode layer 141 and the second electrode layer 142 are vertically aligned with the top surface 12A. In some embodiments, top surfaces of the first dielectric layer 131 and the second dielectric layer 132 are vertically aligned with the top surface 12A.

Figure 7:
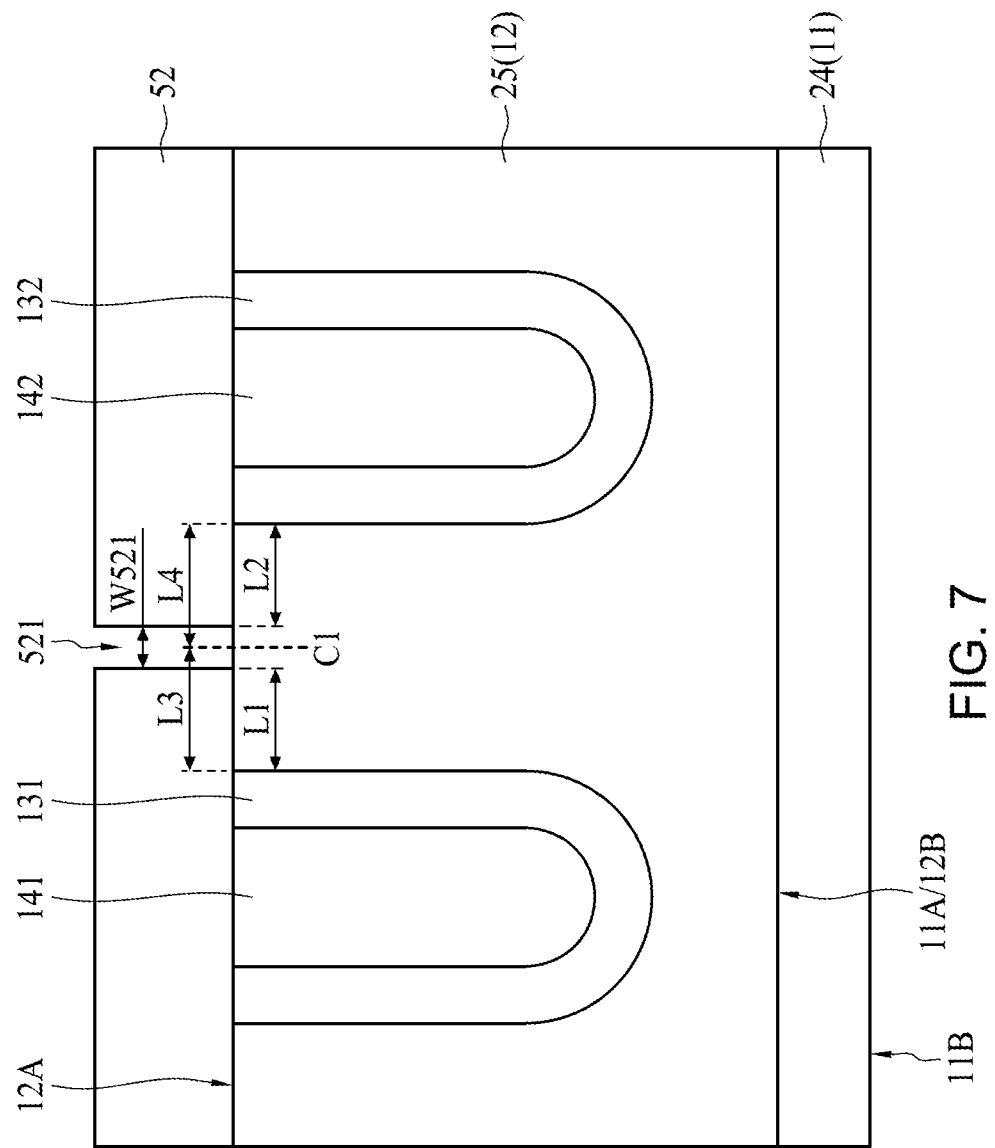
FIG. 7 is a diagram illustrating a semiconductor rectifier device at one stage of the fabrication method according to certain embodiments of the present application.

Referring to FIG. 7, the fabrication method for the semiconductor rectifier device 1 includes forming a patterned layer 52 on the surface 12A of the epitaxial layer 12. The patterned layer 52 covers the first and second trench structures 151 and 152, and exposes a part of the epitaxial layer 12 located between the first trench structure 151 and the second trench structure 152. In some embodiments, the patterned layer 52 has an opening 521 that exposes a part of the epitaxial layer 12 located between the first trench structure 151 and the second trench structure 152. The patterned layer 51 may be a material layer suitable to serve as a mask for subsequent etching processes, such as a photomask, a hardened layer, and a dielectric layer (such as an oxide layer or a nitride layer). In some embodiments, the patterned layer 51 includes an oxide (e.g., silicon oxide). In some embodiments, an oxide layer is formed so that the entire layer covers the surface 12A of the epitaxial layer 12, a patterned photomask is formed on the oxide layer, a part of the oxide layer is removed using the patterned photomask, and then the patterned photomask is removed to form the patterned layer 52 of FIG. 7. The opening 521 is located approximately at the center between of the first trench structure 151 and the second trench structure 152. In some embodiments, the distance L1 from the opening 521 to the first trench structure 151 is approximately equal to the distance L2 from the opening 521 to the second trench structure 152. In some embodiments, the distance L3 from the center of the opening 521 (indicated by a dashed line C1) to the first trench structure 151 is approximately equal to the distance L4 from the center of the opening 521 to the second trench structure 152. In some embodiments, the width W521 of the opening 521 is between 0.3 μm and 0.6 μm.

Figure 8:
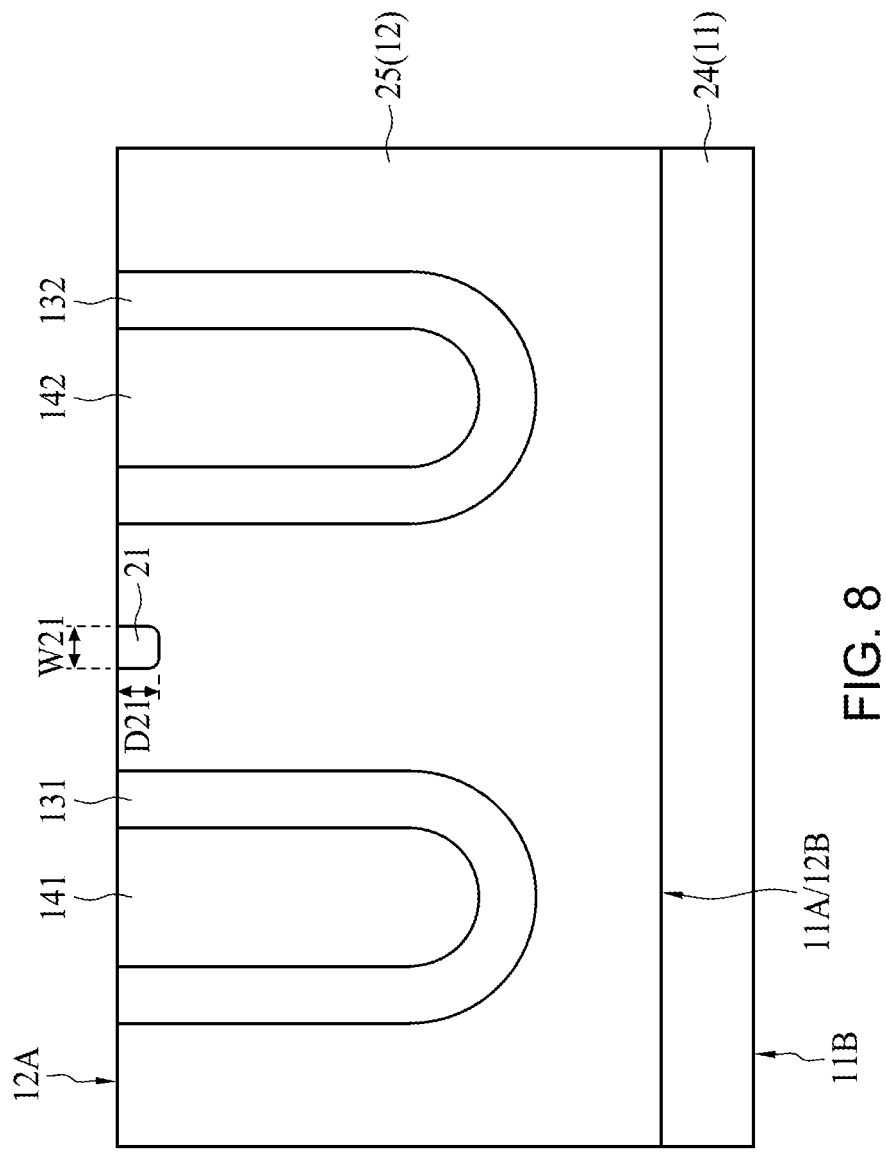
FIG. 8 is a diagram illustrating a semiconductor rectifier device at one stage of the fabrication method according to certain embodiments of the present application.

Referring to FIG. 8, the fabrication method for the semiconductor rectifier device 1 includes performing ion implantation on the surface 12A of the epitaxial layer 12 using the patterned layer 52 as a mask to form a doped region 21 having a second type of doping. The depth D21 of the doped region 21 is less than the depth of the first trench structure 151 or the second trench structure 152. Since the doped region 21 is defined by the opening 521 of the patterned layer 52, the width W21 of the doped region 21 on the surface 12A of the epitaxial layer 12 is approximately the same as the width W521 of the opening 521. In some embodiments, the width W21 of the doped region 21 is between 0.3 μm and 0.6 μm. In some embodiments, the depth D21 of the doped region 21 is between 0.2 μm and 0.8 μm. In some embodiments, the doping concentration of doping ions having a second conductivity type in the doped region 21 is between $1 \times 10^{16}$ and $1 \times 10^{18}$ cm$^{-3}$. After the ion implantation process, a thermal annealing process is performed to activate the doping ions in the doped region 21.

Since a Schottky metal will subsequently be formed on the surface 12A of the epitaxial layer 12, the interface between the epitaxial layer 12 and the Schottky metal will form a Schottky interface, and an electric field generated during the operation of the semiconductor rectifier device 1 will be concentrated in the middle of the first trench structure 151 and the second trench structure 152, and easily concentrated at a location in the middle of the first trench structure 151 and the second trench structure 152 adjacent to the epitaxial layer 12, a region where this electric field is concentrated easily leading to the occurrence of leakage. Forming the doped region 21 in the epitaxial layer 12 in the middle of the first trench structure 151 and the second trench structure 152 adjacent to the surface 12A can effectively block the electric field and avoid the problem of leakage current of the semiconductor rectifier device 1. According to the magnitude and distribution range of the electric field generated by different apparatuses, the width W21 of the doped region 21 (or the lateral area located on the surface 12A) may be adjusted to achieve the effect of blocking the electric field adjacent to the surface 12A. However, if the lateral area of the doped region 21 located on surface 12A is too large, this will cause the VF to rise.

Since the electric field will be concentrated from the first trench structure 151 and the second trench structure 152 to the epitaxial layer 12 therebetween, the depth D21 of the doped region 21 may determine the range of blocking the electric field on both sides in the vertical direction. The greater the range of blocking, the less easily a concentrated electric field will be formed at a location adjacent to the surface 12A. It is shown in some tests that the depth D21 of the doped region 21 has no significant impact on VF, but can improve the electric field blocking effect. Therefore, the depth D21 of the doped region 21 contributes to improving the problem of leakage current. However, the problem of leakage current is still mainly concentrated at the location adjacent to the surface 12A. Therefore, when the depth D21 of the doped region 21 reaches a certain value, it will no longer significantly contribute to the effect of improving the leakage current. The aforementioned range of the depth D21 of the doped region 21 is a preferred numerical range obtained on the basis of the overall size of the semiconductor rectifier device 1 and the limitations of existing fabrication methods and processes, and is not intended to limit the above-mentioned inventive concepts of the present disclosure.

Figure 9:
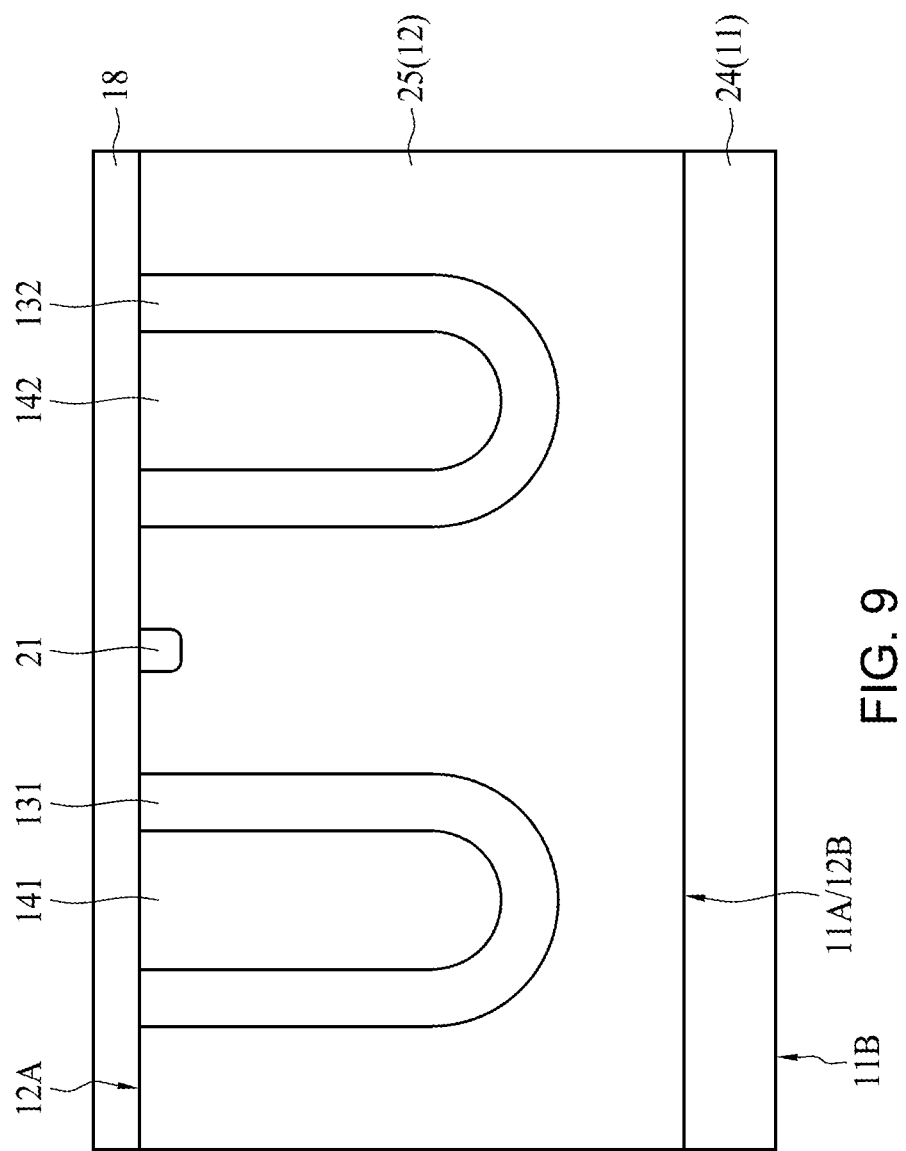
FIG. 9 is a diagram illustrating a semiconductor rectifier device at one stage of the fabrication method according to certain embodiments of the present application.

Referring to FIG. 9, the fabrication method for the semiconductor rectifier device 1 includes conformally forming a metal layer 18 on the surface 12A of the epitaxial layer 12. Schottky metal, such as titanium (Ti), nickel (Ni), molybdenum (Mo), platinum (Pt), nickel platinum (NiPt), or a combination thereof is selected for use as the metal layer 18. In some embodiments, the metal layer 18 interfaces with and is in contact with the surface 12A of the epitaxial layer 12, the top surface of the first trench structure 151, and the top surface of the second trench structure 152. In some embodiments, the metal layer 18 interfaces with the doped region 21. General Schottky barrier rectifier devices only select metals having high Schottky barrier heights, such as platinum and molybdenum, for use to achieve low reverse leakage effects, and avoid using metals having low Schottky barrier heights, such as titanium. The reason is that using metals having low Schottky barrier heights will result in low VF. Although the power loss will be relatively small, the device will be easily affected by the electric field strength. When there is a region having a strong electric field strength, the leakage current will rise sharply.

In the present disclosure, the doped region 21 is formed in a part of the epitaxial layer 12 in which the electric field is concentrated, between the trench structures 151 and 152, which can effectively block the electric field. Compared with the Schottky barrier rectifier device without the doped region 21, not only is the original leakage current problem improved, but also the selection of Schottky metals that can be used is greatly increased, and it is no longer limited to the use of metals having high Schottky barrier heights. Even using metals having low Schottky barrier heights, the same or better performance than existing Schottky barrier rectifier devices can be achieved.

Figure 10:
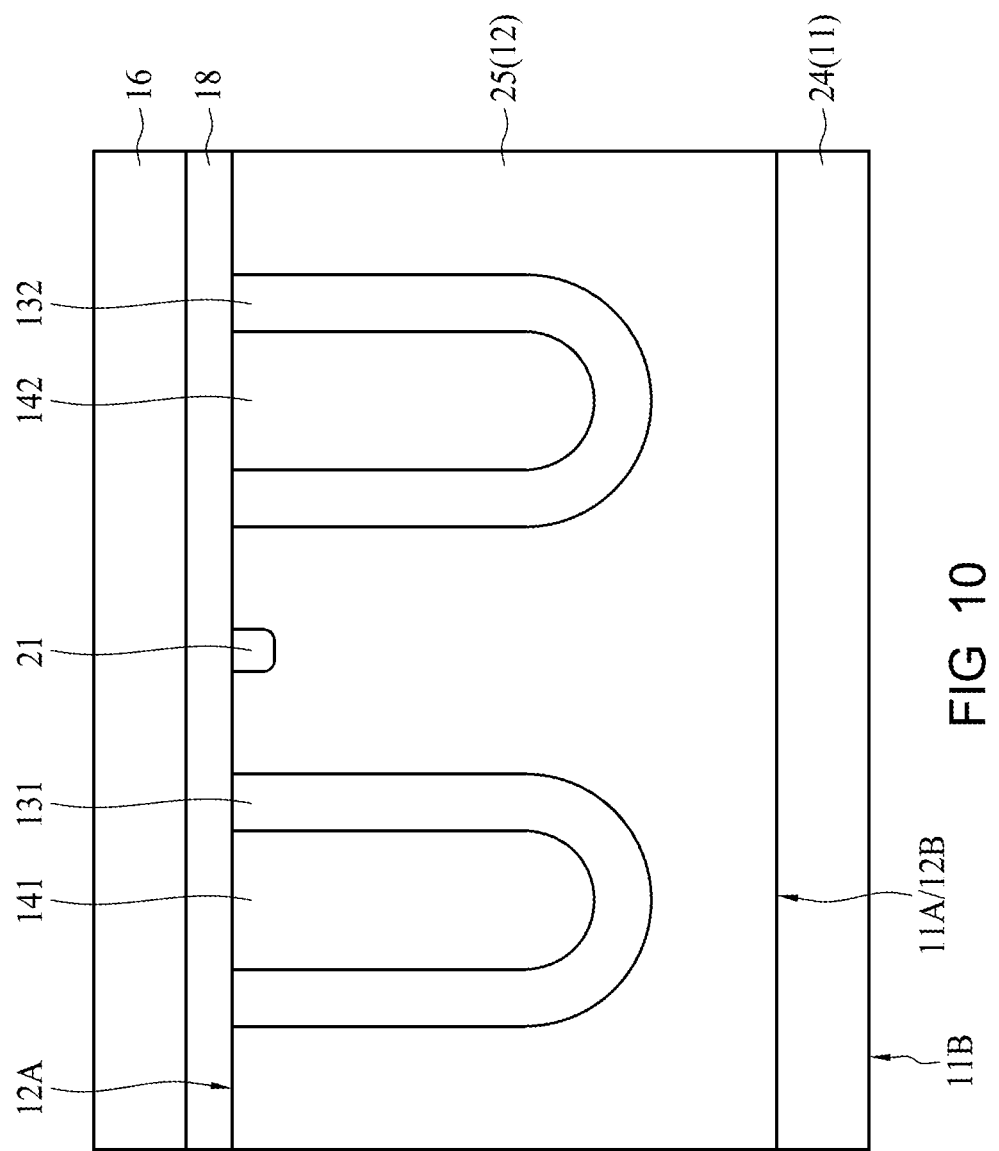
FIG. 10 is a diagram illustrating a semiconductor rectifier device at one stage of the fabrication method according to certain embodiments of the present application.

Referring to FIG. 10, the fabrication method for the semiconductor rectifier device 1 includes forming an upper electrode layer 16 on the metal layer 18. The upper electrode layer 16 serves as an anode electrode of the semiconductor rectifier device 1, and may include a suitable metal material or alloy, such as titanium tungsten (TiW), aluminum (Al), an aluminum silicon alloy (AlSi), an aluminum silicon copper alloy (AlSiCu), or a combination thereof, which is not limited here. After the upper electrode layer 16 is formed, the upper electrode layer 16 and a contact metal 31 may be etched to form a required pattern. Since the etching step is performed according to a required circuit design, the etching step is not illustrated and depicted in the figure. Those skilled in the art can adjust the etching step according to the above content of the present disclosure, so as to form the pattern of the upper electrode layer 16 and the pattern of the metal layer 18 as required.

Figure 11:
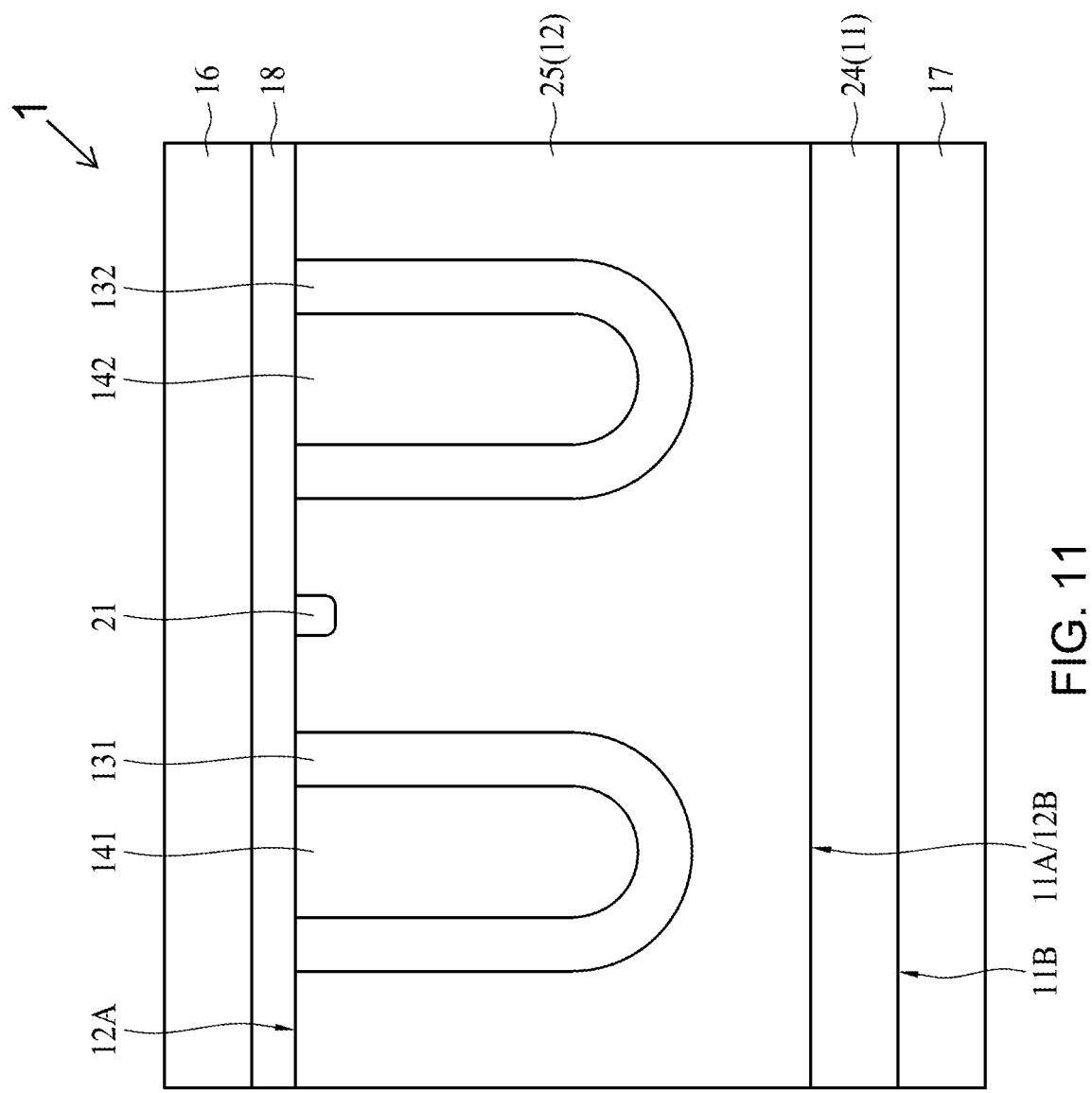
FIG. 11 is a diagram illustrating a semiconductor rectifier device at one stage of the fabrication method according to certain embodiments of the present application.

Referring to FIG. 11, the fabrication method for the semiconductor rectifier device 1 includes forming a lower electrode layer 17 coupled to the substrate 11 below the epitaxial layer 12. The lower electrode layer 17 and the upper electrode layer 16 are located on two opposite sides of the epitaxial layer 12. The doped region 24 of the substrate 11 serves as a cathode contact region of the semiconductor rectifier device 1. The material of the lower electrode layer 17 may be the same as or different from the upper electrode layer 16. In some embodiments, the material of the lower electrode layer 17 includes a titanium nickel silver alloy (TiNiAg). In some embodiments, the lower electrode layer 17 is in contact with the doped region 24 of the substrate 11. In some embodiments, before forming the lower electrode layer 17, the substrate 11 is ground or etched to reduce the thickness of the substrate 11, so as to expose the doped region 24.

Herein, for convenience of description, spatially relative terms such as "below," "under," "lower," "above," "upper," "left side," and "right side" may be used to describe the relationship between one component or feature and another one or plurality of components or features as shown in the accompanying drawings. In addition to the orientation depicted in the accompanying drawings, the spatially relative terms may be intended to encompass different orientations of a device in use or operation. The apparatus may be otherwise oriented (by rotating 90 degrees or at other orientations) and likewise, spatially relative descriptors used herein may correspondingly be interpreted. It should be understood that when a component is referred to as "connected to" or "coupled to" another component, it may be directly connected to or coupled to another component, or an intermediate component may be present.

As used herein, the terms "approximately," "substantially," "essentially," and "about" are used to describe and interpret small variations. When used in conjunction with an event or circumstance, the terms can refer to instances where the event or circumstance occurs exactly as well as instances where the event or circumstance occurs nearly. As used herein regarding a given value or range, the term "about" refers generally to be within ±10%, ±5%, ±1%, or ±0.5% of a given value or range. The range may be expressed herein as one endpoint to another endpoint or between two endpoints. All ranges disclosed herein include endpoints unless otherwise specified. The term "substantially coplanar" may refer to the difference in position of two surfaces located along the same plane being within several microns (μm), such as a difference in position located along the same plane being within 10 μm, 5 μm, 1 μm, or 0.5 μm. When values or properties are referred to as being "substantially" identical, the term may refer to values that are within ±10%, ±5%, ±1%, or ±0.5% of the mean value of the stated values.

The foregoing summarizes the features of several embodiments and the detailed aspects of the present disclosure. The embodiments described in the present disclosure may be easily used as a basis for designing or modifying other processes and structures to facilitate implementation of the same or similar purpose and/or achieve the same or similar advantages of the embodiments introduced herein. Such equivalents are not departing from the spirit and scope of the present disclosure, and various changes, replacements and alterations may be made without departing from the spirit and scope of the present disclosure.

What is claimed is:

1. A semiconductor rectifier device comprising:
   an epitaxial layer, having a top surface and a bottom surface opposite to each other;
   a first doped region, located in the epitaxial layer, wherein the first doped region has a first conductivity type;
   a first trench structure, located in the first doped region and extending from the top surface toward the bottom surface;
   a second trench structure, located in the first doped region and extending from the top surface toward the bottom surface, wherein the second trench structure is adjacent to the first trench structure;
   a second doped region, characterized by a width between opposing sidewalls, located in the epitaxial layer between the first trench structure and the second trench structure, and extending from the top surface toward the bottom surface, wherein a doping concentration of the second doped region is between $1\times10^{16}$ and $1\times10^{18}$ cm$^{-3}$ of a second conductivity type, and a depth of the second doped region is less than a depth of the first trench structure, wherein PN junctions are formed between the opposing sidewalls and the first doped region; and
   a metal layer, located on the top surface of the epitaxial layer, covering the first trench structure, the second trench structure, and the second doped region, wherein the metal layer is in contact with the top surface, forming a Schottky interface, and an entire top surface of the second doped region between the width is in contact with a bottom surface of the metal layer.

2. The semiconductor rectifier device according to claim 1, wherein a doping concentration of the first doped region increases from the top surface toward the bottom surface.

3. The semiconductor rectifier device according to claim 1, wherein a doping concentration of the first doping region adjacent to the top surface is between $4\times10^{15}$ and $7\times10^{15}$ cm$^{-3}$, and a doping concentration of the first doping region adjacent to the bottom surface is between $1\times10^{16}$ and $4\times10^{16}$ cm$^{-3}$.

4. The semiconductor rectifier device according to claim 1, wherein a distance from a center of the second doped region to the first trench structure is approximately equal to a distance from the center of the second doped region to the second trench structure.

5. The semiconductor rectifier device according to claim 1, wherein a width of the second doped region is between 0.3 microns and 0.6 microns.

6. The semiconductor rectifier device according to claim 1, wherein a depth of the second doped region is between 0.2 microns and 0.8 microns.

7. The semiconductor rectifier device according to claim 1, wherein a top surface of the first trench structure or a top surface of the second trench structure is vertically aligned with the top surface of the epitaxial layer.

8. The semiconductor rectifier device according to claim 1, wherein the first trench structure comprises a first dielectric layer and a first electrode layer surrounded by the first dielectric layer, and the second trench structure comprises a second dielectric layer and a second electrode layer surrounded by the second dielectric layer.

9. The semiconductor rectifier device according to claim 1, further comprising:
   an anode electrode, located on the metal layer;
   a substrate, coupled to the bottom surface of the epitaxial layer; and
   a cathode electrode, in contact with the substrate.

10. The semiconductor rectifier device according to claim 1, wherein the depth of the first trench structure is between 8 microns and 10 microns, and a depth of the second trench structure is approximately equal to the depth of the first trench structure.

11. The semiconductor rectifier device according to claim 1, wherein the width of the second doped region is less than a width of the first doped region between the first trench structure and the second trench structure.

12. A method for fabricating a semiconductor rectifier device, comprising:
    forming an epitaxial layer having a first conductivity type on a substrate;
    forming a first trench structure and a second trench structure adjacent to the first trench structure in the epitaxial layer;
    forming a doped region having a doping concentration between $1\times10^{16}$ and $1\times10^{18}$ cm$^{-3}$ of a second conductivity type and characterized by a width between opposing sidewalls in the epitaxial layer between the first trench structure and the second trench structure, wherein PN junctions are formed between the opposing sidewalls and the epitaxial layer; and
    forming a metal layer on the epitaxial layer, wherein the metal layer covers the first trench structure, the second trench structure, and the doped region, and an entire top surface of the doped region between the width is in contact with a bottom surface of the metal layer.

13. The method according to claim 12, wherein forming the epitaxial layer having the first conductivity type comprises:
    introducing ions having the first conductivity type by epitaxial growth, wherein a concentration of the introduced ions decreases over time during the epitaxial growth, and a doping concentration of the epitaxial layer decreases from a bottom surface of the epitaxial layer to a top surface of the epitaxial layer.

14. The method according to claim 12, wherein forming the first trench structure and the second trench structure comprises:
    forming a patterned layer on a top surface of the epitaxial layer to define locations of the first trench structure and the second trench structure;
    forming a first trench and a second trench using the patterned layer as a mask;
    forming a dielectric layer conformally covering the epitaxial layer, wherein a first part of the dielectric layer conformally covers the first trench, and a second part of the dielectric layer conformally covers the second trench;

forming a polysilicon layer on the dielectric layer, wherein a first part of the polysilicon layer fills the first trench structure, and a second part of the polysilicon layer fills the second trench structure; and removing the polysilicon layer and the dielectric layer located above the top surface of the epitaxial layer, wherein a top surface of the first trench structure, a top surface of the second trench structure, and the top surface of the epitaxial layer are vertically aligned.

15. The method according to claim 14, wherein removing the polysilicon layer and the dielectric layer located above the top surface of the epitaxial layer comprises:

performing a first etching process against the polysilicon layer to remove a portion of the polysilicon layer; and performing a second etching process against the dielectric layer to remove a portion of the dielectric layer.

16. The method according to claim 14, wherein a thickness of the dielectric layer is between 0.2 microns and 2 microns.

17. The method according to claim 12, wherein the metal layer comprises titanium, molybdenum, nickel, platinum, nickel platinum, an alloy thereof, or a combination thereof.

18. The method according to claim 12, further comprising:

forming an anode electrode on the metal layer;

reducing a thickness of the substrate from a backside of the substrate; and forming a cathode electrode coupled to the backside of the substrate.

19. The method according to claim 18, wherein the anode electrode comprises aluminum, an aluminum silicon alloy, and an aluminum silicon copper alloy, and the cathode electrode comprises a titanium nickel silver alloy.

20. The method according to claim 18, wherein the anode electrode has a flat bottom surface interfacing with a top surface of the epitaxial layer.

21. The method according to claim 12, wherein the width of the doped region is less than a width of the epitaxial layer between the first trench structure and the second trench structure.

* * * * *